US006362968B1

(12) United States Patent
Lajara et al.

(10) Patent No.: US 6,362,968 B1
(45) Date of Patent: Mar. 26, 2002

(54) COMPUTER SYSTEM MOTHERBOARD STIFFENER

(75) Inventors: Robert J. Lajara, San Jose; Hassan Siahpolo, Campbell; Ronald Barnes, Livermore; Kenneth Kitlas, San Jose, all of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/340,961

(22) Filed: Jun. 28, 1999

(51) Int. Cl.[7] .................................................. H05K 7/14
(52) U.S. Cl. ........................ 361/752; 361/753; 361/756; 361/759; 361/801; 361/808; 211/41.17; 312/265.1
(58) Field of Search ................................. 361/683, 752, 361/753, 756, 759, 801, 802, 804, 807, 808, 825; 211/41.17; 312/261, 265.1

(56) References Cited

U.S. PATENT DOCUMENTS

| | | | | |
|---|---|---|---|---|
| 4,241,381 A | * | 12/1980 | Cobaugh et al. | 361/785 |
| 4,388,672 A | * | 6/1983 | Skill | 361/803 |
| 4,661,888 A | * | 4/1987 | Jewell et al. | 361/818 |
| 5,041,944 A | * | 8/1991 | Campisi | 361/682 |
| 5,884,988 A | | 3/1999 | Foo et al. | |
| 6,166,916 A | * | 12/2000 | Jelinger | 361/756 |

* cited by examiner

Primary Examiner—Jayprakash N. Gandhi
(74) Attorney, Agent, or Firm—Conley, Rose & Tayon, PC; B. Noël Kivlin

(57) ABSTRACT

A stiffener for a printed circuit board where the stiffener is placed between the printed circuit board and a wall of the metal chassis in a computer system housing. The loaded printed circuit board may first be mounted on the stiffener, which, in turn, may then be mounted on the appropriate wall of the chassis along with the circuit board. Alternately, the stiffener may first be mounted on the appropriate chassis wall, and the circuit board may then be mounted on the stiffener. Additional circuit components may then be added onto the circuit board. The lies between the circuit board and the wall of the chassis on which the circuit board is being mounted. The back plane support provided by the stiffener may reduce damage to the conducting paths of the printed circuit board due to pressures exerted during component mounting, manufacture, transportation, etc. Additionally, a circuit board carrying densely populated electronic components may be easily mounted on or removed from the chassis without damage. Adequate board-to-chassis grounding may also be accomplished through the sheet metal stiffener frame. Horizontal and vertical struts in the stiffener frame may provide additional stiffness and rigidity in the vicinity of the high density connectors on the circuit board. Besides increased stability, unusually tight tolerances on the flatness of the circuit board surface near high density connectors may be achieved with the support provided by the stiffener.

23 Claims, 2 Drawing Sheets

COMPUTER SYSTEM MOTHERBOARD STIFFENER

BACKGROUND OF THE INVENTION

1. Field of the Invention

The present invention broadly relates to computer systems, and more particularly, to a stiffener for a printed circuit board that is to be mounted on a chassis inside a computer system housing.

2. Description of the Related Art

Modem computer systems generally include a housing or enclosure, a display device and an external command/data input device. The display device may be a CRT (cathode ray tube) monitor, e.g., in a desktop computer system, or it could be a TFT (thin film transistor) screen, e.g., in a portable laptop computer. The external input device may be a keyboard, a pointing device, e.g., a mouse, or a combination of them. The system housing is an enclosure that houses the hardware components that perform, along with necessary software, various processing tasks as requested by the user. The housing may also include one or more power supplies to supply proper electrical power to various electronic hardware circuit elements. Auxiliary storage device drives, e.g., a floppy disk drive or a CD-ROM drive may also be housed within the computer system housing. Additionally, hard disk drive for large amount of data storage is almost invariably included within the computer housing for greater digital information storage capacity.

Generally, a computer system housing includes a metal chassis upon which one or more computer system components, e.g., cooling fans, printed circuit boards, hard disk drive, etc., are mounted during system fabrication. The metal chassis may then be covered with one or more panels to enclose the system components.

A printed circuit board may generally contain a number of electronic devices, such as, resistors, capacitors, power supply unit, memory chips or memory cards, one or more microprocessors, one or more co-processors, various integrated circuits, etc. A printed circuit board may also contain connectors for one or more of these devices and additional attachment units. One or more of these connectors may require unusually tight tolerances on the flatness of the printed circuit board in the vicinity of the connector to allow for stability in electrical connections and also to maintain a tighter grip on an electronic component mounted on the printed circuit board through the corresponding connector.

A printed circuit board is generally mounted directly on the computer system chassis with requisite electronic components already on the printed circuit board. However, any future insertion onto a directly chassis-mounted printed circuit board of a component or electronic part by a user or at a later stage during fabrication of the computer system prior to shipping may result in developments of small cracks or breakage points along the conducting paths of the printed circuit board. Additionally, a heavily loaded printed circuit board that is directly mounted on the system chassis may similarly get damaged during mounting or during later upgrading. Furthermore, electronic components inserted into connectors requiring substantially flat circuit board surface near the connecting area may not obtain requisite tightness of electrical connections on a loaded printed circuit board.

It may therefore be desirable to provide a back plane support for a printed circuit board prior to its being mounted on the metal chassis of the computer system housing.

SUMMARY OF THE INVENTION

The problems outlined above may in large part be solved by a computer system housing where a stiffener is placed on a wall of the metal chassis within the housing and between a printed circuit board and the wall so as to provide a back plane support for the printed circuit board. The printed circuit board may be attached to the stiffener prior to mounting the complete assembly onto the chassis. Alternately, the stiffener may first be mounted on the chassis, and the circuit board carrying required electronic components may then be mounted on the stiffener.

The stiffener may include a support frame made up of a plurality of longitudinal bars. The longitudinal bars may be manufactured pre-attached using a single progressive tool during the support frame fabrication, or may be individually manufactured and later attached in the desired shape to form the support frame structure. Each longitudinal bar may have one or more holes that may correspond to similar holes in the circuit board to be mounted. The holes receive fasteners to securely fasten the circuit board to the stiffener. In an alternative embodiment, each longitudinal bar may have a fixed number of holes irrespective of the corresponding number of holes in the circuit board to be fastened. A horizontal strut may also be manufactured as part of the support frame structure or as an independently attachable unit. The horizontal strut may provide additional back plane support to the printed circuit board carried by the support frame.

Further, the stiffener may include one or more vertical struts that may be attached to the support frame for additional support to those portions of the circuit board that may be prone to carry dense circuitry or that may require tighter circuit board tolerances around one or more connectors present therein. In one embodiment, each longitudinal bar, one or more vertical struts and the horizontal strut may have one or both edges raised to a predetermined height to form a spacing between the circuit board and the stiffener. This additional spacing may be desirable to prevent direct contact of circuit board's conducting paths with the stiffener frame.

The back plane support provided by the stiffener may reduce damage to the printed circuit board due to pressures exerted during component mounting on the circuit board that is already installed on the chassis. Additionally, a circuit board carrying densely populated electronic components may be easily mounted on or removed from the chassis without damage. Requisite flatness of the printed circuit board may also be maintained in the vicinity of larger connectors with the help of vertical struts.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1B:
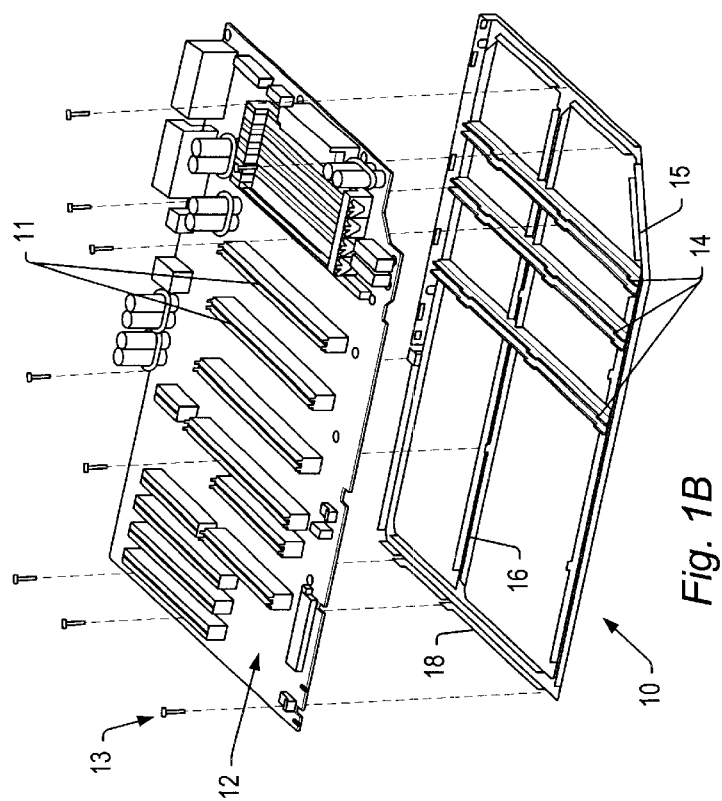
FIG. 1B depicts an arrangement whereby a circuit board is attached to the stiffener shown in FIG. 1A.
Figure 1A:
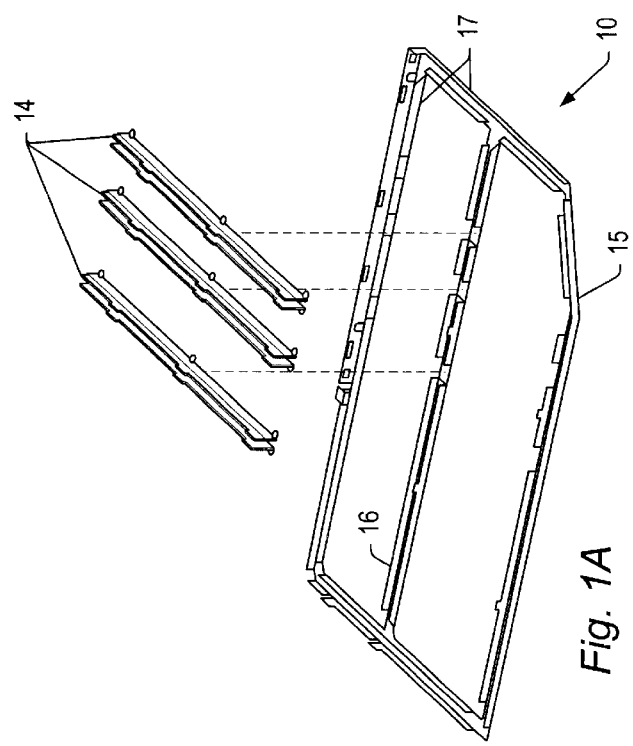
FIG. 1A shows a perspective view of the constituent parts of a stiffener frame.

Referring now to FIG. 1A, a perspective view of the constituent parts of a stiffener frame or, simply, a stiffener 10 is shown. The stiffener 10 comprises a support frame 15 constituted of a plurality of longitudinal bars or arms 17. Further support to a printed circuit board may be provided by addition of vertical struts 14 to the support frame 15 as illustrated in the embodiment of FIG. 1A. A horizontal strut 16 may form part of the support frame and may provide additional attachment points for the vertical struts. The horizontal strut 16 and the longitudinal bars 17 may be jointly referred to as "longitudinal sections" in the following discussion.

The longitudinal bars 17 and the horizontal strut 16 may be manufactured pre-attached, i.e., in the form of the support frame 15, by punching and forming the whole assembly through a single progressive tool. Alternately, each longitudinal bar 17 and the horizontal strut 16 may be individually manufactured and may be provided with attachment mechanisms (e.g., permanent adhesive coating, openings for fasteners like screws or rivets, etc.) to connect into the desired shape for the support frame 15. In one embodiment, one or more of the longitudinal sections may have variable length to adjust to the shape of the printed circuit board to be mounted thereon. In another embodiment, the longitudinal sections may be hinged together, thereby allowing flexible adjustment of the shape of the support frame.

Each longitudinal bar 17, the horizontal strut 16 and the vertical struts 14 may have one or both edges 18 (FIG. 1B) raised to a predetermined height to form a spacing between the circuit board and the stiffener, as is illustrated in the embodiment in FIGS. 1A and 1B. This additional spacing may be desirable to prevent direct contact of circuit board's conducting paths with the stiffener frame. The vertical struts 14 and the longitudinal sections (including a pair of longitudinal bars 17 and the horizontal strut 16) that receive the vertical struts 14 may be designed in a way such that the vertical struts may be snapped into the corresponding openings in the longitudinal sections. Alternately, the vertical struts 14 may be securely fastened to the longitudinal sections using fasteners, such as screws, nuts and bolts, rivets, etc.

Turning now to FIG. 1B, an arrangement whereby a circuit board 12 is attached to the stiffener 10 is illustrated. The longitudinal bars 17, the horizontal strut 16 and the vertical struts 14 may have holes or slots at locations that correspond to holes or slots at similar locations in the printed circuit board 12. In one embodiment, each longitudinal bar 17 and the horizontal strut 16 (and, preferably, each vertical strut 14) may have a fixed number of holes irrespective of the corresponding number of holes in the circuit board to be fastened. The system designer may select the holes that may receive fasteners and the holes that may not.

The fasteners 13 may be inserted through the side of the circuit board 12 as illustrated in FIG. 1B. Fasteners may include screws, nuts and bolts, rivets, etc. After the circuit board 12 is mounted on the stiffener 10, the complete assembly (i.e., the stiffener and the circuit board) may then be mounted on the appropriate location on the computer system chassis. The circuit board 12 may first be mounted on the stiffener 10 without any electronic components thereon, as is illustrated in FIG. 1B. Alternately, the circuit board 12 may carry some of the components prior to its being mounted on the stiffener 10. In one embodiment, the stiffener 10 may first be mounted on the computer system chassis, and the circuit board, with or without components, may then be mounted on top of the stiffener 10.

It may be preferable to place the stiffener 10 at the bottom side of the circuit board 12 because of less encumbrance from the circuit components mounted on the circuit board 12. Further, the presence of densely packet circuit components on the top of the circuit board 12 reduces enough open space for the stiffener 10. Generally, there may be less circuit components on the bottom side of the circuit board 12, and, hence, the vertical and horizontal struts may be made stiffer because of relative absence of the need to make these struts flexible to accommodate circuit components. Stiffer horizontal and vertical struts are desirable especially to provide tight tolerances around high density connectors 11. An example of a high density connector is an AMP Mictor connector with a relatively large number of connecting paths.

In one embodiment, the high density connectors 11 (preferably, the AMP Mictor connectors) may be dual in-line connectors. Further, the connectors 11 may require an unusually tight tolerance on the flatness of the circuit board 12 in the region of the connectors. In some applications, for example, when the circuit board 12 is a motherboard for a computer system, a flatness of +/−0.1 mm in the vicinity of the connectors may be desirable. This may be achieved by sandwiching the dual in-line connectors between the stiffener 10 on the bottom side of the circuit board 12 and a plastic stiffener (not shown) on the top side of the circuit board 12 (as part of a module mounting scheme). In this fashion, tight tolerances can be locally met at the connectors 11. The rest of the circuit board 12 may have looser tolerance requirements.

The longitudinal bars 17, the horizontal strut 16 and the vertical struts 14 may be made of sheet metal for requisite stiffness. As the support frame 15 resides along all four of the circuit board 12 edges, the support frame provides a stable back-plane support to the circuit board 12. Further, the addition of horizontal and vertical struts further enhance the stiffness in the vicinity of the high density connectors 11. The tolerance requirements may thus be met when the circuit board 12 is attached to the stiffener 10.

Besides helping provide tight tolerances in the region of the connectors 11, the vertical struts 14 may provide additional support to those parts of the circuit board that may be prone to carry dense circuitry or that may experience heavy loading of circuit components. For example, a motherboard may be mounted on the computer system chassis with the stiffener 10 between the chassis and the motherboard. The motherboard may carry a large number of electronic components, including, for example, memory cards, processors, connectors, etc. Further, a user may desire to upgrade the computer system by inserting, for example, additional processor(s) or additional memory cards onto the motherboard that is already mounted on the chassis through the stiffener. The vertical struts 14 may provide additional back plane support in such a situation where components may need to be added to the already mounted circuit board. The damage caused by cracks or abrasions on the conducting paths or surface of the printed circuit board (when mounted directly, i.e., without the stiffener 10 on the chassis), or the effects of external pressure on the fragile circuit board may thus be prevented.

Figure 2:
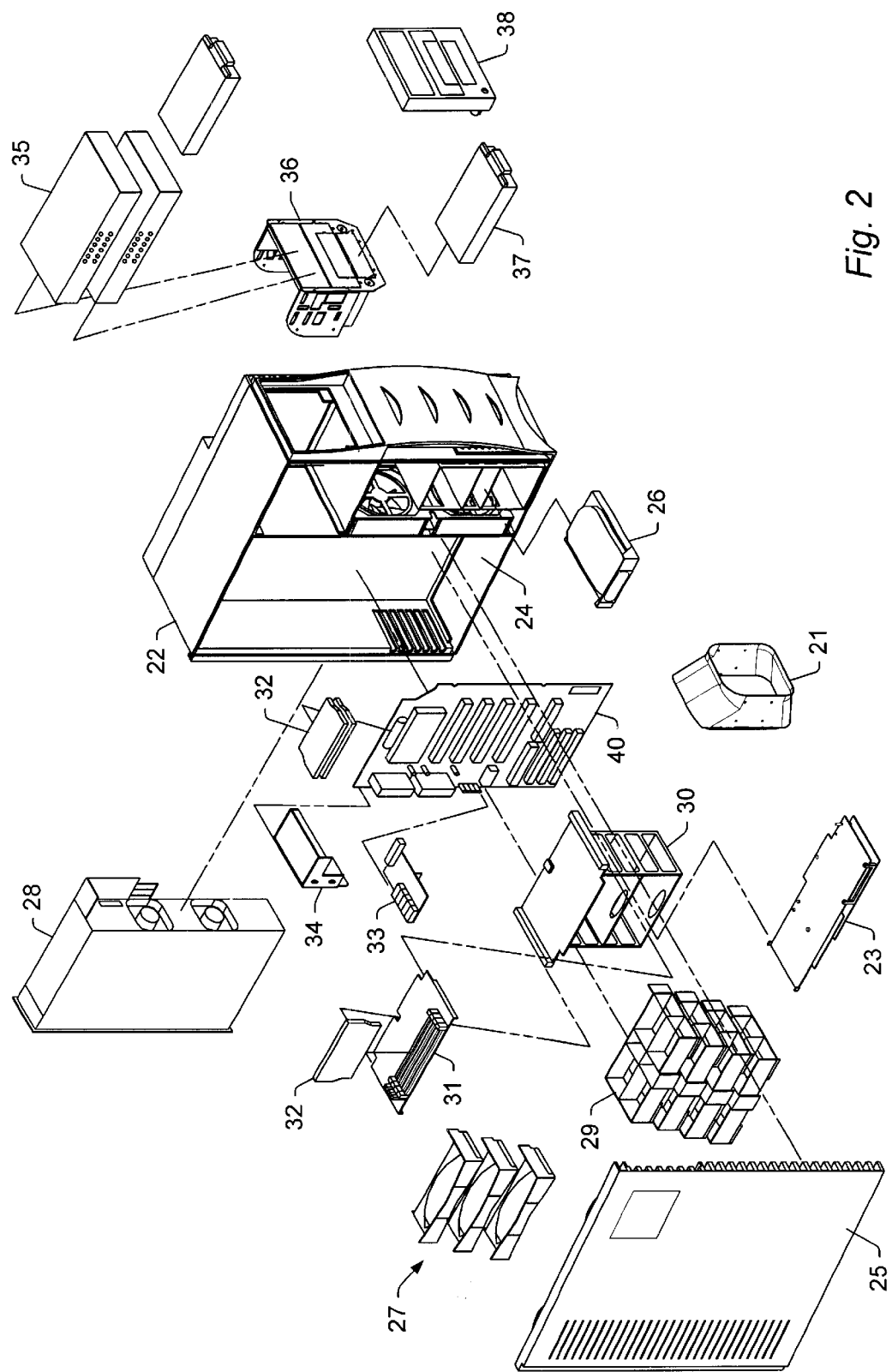
FIG. 2 shows a number of computer system components in a disassembled view of a computer system housing.

Referring now to FIG. 2, a number of computer system components in a disassembled view of a computer system housing 20 are shown. The computer housing 20 may include a metal chassis 24 on which a number of computer system components may be mounted. Some of the components include a power supply unit 28, a hard disk drive unit 26, a peripheral drive storage assembly 36 that may further include a floppy disk drive 37 and one or more CD ROM (Read Only Memory) drives 35, a front covering 38 for the peripheral drive storage assembly 36, and one or more air-guide sections 21 that may be mounted on the cooling fans within the housing 20. Additionally, a printed circuit board 12 (here, a motherboard 40) that is attached to a stiffener (not visible in FIG. 2) may be mounted on a wall of the chassis 24 as illustrated in FIG. 2. The stiffener 10 (not visible in FIG. 2) lies between the chassis wall and the motherboard 40.

Although the following discussion concentrates on the motherboard 40, it is noted that the discussion applies equally to any circuit board besides the motherboard 40 in FIG. 2. The motherboard 40 may include one or more memory modules 32 mounted on it through appropriate connectors. An additional memory card 31 may be provided to expand the memory capacity of the motherboard 40. Various audio and video cards, e.g., the graphics card 23 and the audio module 33 may be inserted onto the motherboard for multimedia applications. A power converter 34 (e.g., from high voltage DC to low voltage DC) may reside on the motherboard. Finally, a shroud 30 that houses a number of processing units or processors may be mounted on the motherboard. The processing units may reside in appropriate modules 29, and any empty module (i.e., the module without a processing unit) may include filler modules 27 therein. The filler modules 27 may not have openings therein to allow unblocked airflow to other processors for cooling.

It may be appreciated by one skilled in the art that the motherboard 40 may carry heavily dense electronic components and circuitry. Further, the motherboard 40 may be accessed frequently during system upgrades. The stiffener for the motherboard 40 may thus provide the needed back plane support given the large size and heavy loading of the motherboard. Other circuit boards in the housing 20 may also have similar stiffeners between them and the chassis walls so as to provide secure and rigid back plane supports.

Due to the vast size of the stiffener (not visible in FIG. 2) that lies behind the motherboard 40, many mounting points between the stiffener and the motherboard are possible. The circuit board 12 in FIG. 1B may be the motherboard 40, and, therefore, the exemplary view in FIG. 1B showing different mounting points and corresponding fasteners 13 may also depict the motherboard 40 and the stiffener 10. In a preferred embodiment, fifteen mounting points on the motherboard 40 and the stiffener 10 (FIG. 1B) are provided.

The stiffener frame may be made of sheet metal. In that event, the mounting points on the motherboard 40 may also provide board-to-chassis grounding when the motherboard is mounted on the stiffener frame with metal connectors or fasteners and the stiffener, in turn, is mounted on the metal chassis 24. The placement of intervening metal stiffener frame allows for better than adequate board-to-chassis grounding for EMI (electromagnetic interference) generated due to the presence on the motherboard 40 of electronic components with very high clock speeds. The stiffener may also provide board-to-chassis grounding for any ESD (electrostatic discharge) on the motherboard 40. The stiffener frame provides significant metal-to-metal contact between the bottom of the stiffener frame and the wall of the chassis the stiffener is mounted to. Jack screws on certain connectors, e.g., I/O connectors, on the motherboard 40 may not be required to mount the motherboard 40 on the chassis 24 to achieve adequate grounding of electromagnetic signals.

As noted earlier, the stiffener may serve as the "backbone" of the motherboard 40 that is carrying densely packed electronic circuitry and components. The motherboard 40 is mounted on the chassis 24 with the stiffener (not visible in FIG. 2) as the mounting vehicle. Abrasions and breakage of conducting paths on the motherboard due to direct mounting of the motherboard on the chassis may thus be avoided. Furthermore, the larger size of the stiffener frame may allow for bigger and grosser mounting features on the appropriate wall of the chassis. These large lead-in features on the chassis may allow a user to guide the motherboard 40 against the stiffener without the need to touch the motherboard. Motherboard may automatically align itself with the stiffener surface, and may be easily secured against the chassis with minimal sliding motion. The presence of the stiffener frame on the back of the motherboard may allow the motherboard material to withstand high flex forces from connector insertion and extraction, from general handling during manufacture and shipment, from assembly into the chassis, etc. The stiffener frame may further provide support to sensitive electronic components on the motherboard and may reduce shocks and vibrations transmitted to those components during the activities mentioned in the previous sentence.

The chassis 24, after having all the components mounted thereon, may be covered on different sides (e.g., top, left side, right side, front, etc.) by one or more panels before the housing 20 is ready for shipping. For example, the panel 22 may cover the top of the metal chassis 24, whereas the panel 25 may enclose the left hand side opening in the chassis as shown in FIG. 2. These panels may be of plastic or acrylic-type material to provide strength during transportation of the housing 20.

The foregoing discloses a stiffener design that provides back plane support for a printed circuit board, e.g., a motherboard, and lies between the circuit board and the wall of the chassis on which the circuit board is being mounted. The circuit board may first be mounted on the stiffener, and the complete assembly may then further be mounted on the appropriate chassis wall. Alternately, the stiffener may first be mounted on the appropriate chassis wall, and the circuit board may then be mounted on the stiffener. Additional circuit components may then be added onto the circuit board. The back plane support provided by the stiffener may reduce damage to the conducting paths of the printed circuit board due to pressures exerted during component mounting. Additionally, a circuit board carrying densely populated electronic components may be easily mounted on or removed from the chassis without damage. Adequate board-to-chassis grounding may also be accomplished through the sheet metal stiffener frame.

While the invention is susceptible of various modifications and alternative forms, specific embodiments thereof are shown by way of examples in the drawings and are herein described in detail. It should be understood, however, that the drawings and detailed description thereto are not intended to limit the invention to the particular forms disclosed, but on the contrary, the intention is to cover all such modifications, equivalents and alternatives as falling within the spirit and scope of the present invention as defined by the appended claims.

What is claimed is:

1. A stiffener for a printed circuit board, wherein the stiffener is configured to lie between the printed circuit board and a computer chassis when said printed circuit board is mounted on the computer chassis, the stiffener comprising:

a support frame configured to reside along the periphery of the printed circuit board when stiffener is mounted on the printed circuit board, wherein the support frame comprises:

a pair of longitudinal bars forming opposite edges of the support frame; and a pair of cross bars forming opposite ends of the support frame;

wherein one or more of the longitudinal and cross bars include one or more openings to receive one or more fasteners when the printed circuit board is mounted on the stiffener;

a longitudinal strut within the periphery of the support frame connecting the pair of cross bars and positioned in parallel to the pair of longitudinal bars of the support frame; and a plurality of cross struts, wherein the cross struts are mounted within the periphery of the support frame and orthogonal to the longitudinal strut, wherein each of the plurality of cross struts includes one or more apertures.

2. The stiffener of claim 1, wherein the longitudinal bars and said cross bars form a substantially polygonal shape for said support frame.

3. The stiffener according to claim 2, wherein each of the longitudinal bars has one or more first notches formed therein at predetermined distances along the length thereof, and wherein the one or more first notches in one of the longitudinal bars are aligned with the one or more first notches in the other of the longitudinal bars.

4. The stiffener as in claim 3, wherein the longitudinal strut includes:

one or more second notches along the length of the longitudinal strut, wherein the one or more second notches are aligned with the one or more first notches in both of the pair of longitudinal bars.

5. The stiffener of claim 4, wherein each of the cross struts is configured to be attached to the pair of longitudinal bars and to the horizontal strut through insertion thereof into a pair of the one or more first notches and into one of the one or more second notches.

6. The stiffener according to claim 5, wherein the support frame and the one or more vertical struts are made of sheet metal.

7. The stiffener of claim 5, wherein each of the longitudinal bars, the cross bars, the longitudinal strut and the plurality of vertical struts have one or more sides raised to a predetermined height.

8. The stiffener according to claim 4 wherein each of the plurality of cross struts is attached to the pair of longitudinal bars and to the longitudinal strut through insertion thereof into a pair of the one or more first notches and into one of the one or more second notches.

9. The stiffener of claim 5, wherein the one or more cross struts are substantially parallel to the pair of cross bars.

10. The stiffener as in claim 4, wherein the support frame is made of sheet metal.

11. The stiffener as recited in claim 1, wherein the one or more apertures in each of the cross struts is configured for receiving a fastener for attaching stiffener to the printed circuit board.

12. The stiffener as recited in claim 11, wherein the apertures are holes.

13. The stiffener as recited in claim 11, wherein the apertures are slots.

14. A computer system comprising:

a chassis;

a motherboard;

a stiffener having an outer perimeter that is substantially the same as an outer perimeter of the motherboard; and wherein the stiffener is mounted on a wall of the chassis and the motherboard is mounted on the stiffener for a back plane support therefrom and wherein the stiffener includes:

a support frame configured to reside along the periphery of the printed circuit board when stiffener is mounted on the printed circuit board, wherein the support frame comprises:

a pair of longitudinal bars forming opposite edges of the support frame; and a pair of cross bars forming opposite ends of the support frame;

wherein one or more of the longitudinal and cross bars include one or more openings to receive one or more fasteners when the printed circuit board is mounted on the stiffener;

a longitudinal strut within the periphery of the support frame connecting the pair of cross bars and positioned in parallel to the pair of longitudinal bars of the support frame; and a plurality of cross struts, wherein the cross struts are mounted within the periphery of the support frame and orthogonal to the longitudinal strut, wherein each of the plurality of cross struts includes one or more apertures.

15. The computer system of claim 14, wherein the longitudinal bars and the cross bars include:

one or more openings to receive one or more fasteners with which the motherboard is mounted on the stiffener.

16. The computer system as in claim 15, wherein each of the pair of longitudinal bars of the support frame has one or more first notches formed therein at predetermined distances along the length thereof, and wherein the one or more first notches in one of the pair of longer edges are vertically aligned with the one or more first notches in the other of the pair of longitudinal bars.

17. The computer system according to claim 16, wherein the support frame further comprises:

a longitudinal strut connecting the pair of cross bars and positioned substantially parallel to the pair of longitudinal bars of the support frame, wherein the longitudinal strut includes:

one or more second notches along the length of the longitudinal strut, wherein the one or more second notches are vertically aligned with the one or more first notches in both of the pair of longitudinal bars.

18. The computer system of claim 17, wherein each of the plurality of cross struts is attached to the each of the pair of longitudinal bars and to the longitudinal strut through insertion thereof into a pair of the one or more first notches and into one of the one or more second notches.

19. The computer system as in claim 18, wherein the each of the plurality of cross struts is parallel to the pair of shorter edges.

20. The computer system of claim 18, wherein the support frame and the plurality of cross struts are made of sheet metal.

21. The computer system as recited in claim 14, wherein the one or more apertures in each of the cross struts is configured for receiving a fastener for attaching stiffener to the motherboard.

22. The computer system as recited in claim 21, wherein the apertures are holes.

23. The computer system as recited in claim 21, wherein the apertures are slots.

* * * * *